United States Patent [19]

Veale

[11] 4,046,960
[45] Sept. 6, 1977

[54] AUDIO FIDELITY FREQUENCY EQUALIZER SYSTEM

[76] Inventor: John R. Veale, 2925 Greenfield Ave., Los Angeles, Calif. 90025

[21] Appl. No.: 645,805

[22] Filed: Dec. 31, 1975

[51] Int. Cl.² ............................................. H03H 7/16
[52] U.S. Cl. .................................. 179/1 D; 330/109; 333/28 T
[58] Field of Search ............ 179/1 D, 1 AT; 330/109; 333/28 T

[56] References Cited

U.S. PATENT DOCUMENTS

| | | | |
|---|---|---|---|
| 3,356,962 | 12/1967 | Morgan | 330/109 |
| 3,473,142 | 10/1969 | Herrero et al. | 330/109 |
| 3,643,173 | 2/1972 | Whitten | 330/109 |
| 3,752,928 | 8/1973 | Flickinger | 179/1 D |
| 3,895,309 | 7/1975 | Rollett et al. | 330/109 |
| 3,921,104 | 11/1975 | Gundry | 179/1 D |
| 3,936,777 | 2/1976 | Rollett et al. | 330/109 |

Primary Examiner—Douglas W. Olms
Attorney, Agent, or Firm—Robert J. Schaap

[57] ABSTRACT

An audio fidelity frequency equalizer system for use with audio fidelity sound equipment in order to frequency contour sound reproduction to obtain a desired listening environment. The frequency equalizer system of the present invention includes a plurality of potentiometer controls for adjusting the frequency output in each of the eleven major separate octave bands which cover a range from approximately 20 Hz to approximately 20,000 Hz. The frequency equalizer system of the present invention includes an operational amplifier with each of the aforementioned potentiometers connected across the equalizer in feedback relationship. Moreover, each of the potentiometers operate in conjunction with a unique resonance circuit in order to achieve the desired frequency adjustability of the octave bands.

17 Claims, 4 Drawing Figures

AUDIO FIDELITY FREQUENCY EQUALIZER SYSTEM

BACKGROUND OF THE INVENTION

This invention relates in general to certain new and useful improvements in frequency equalizers and, more particularly, to frequency equalizers which employ a unique resonant circuit and which serve as tunedfilters to create a symmetrical feedback around the main operational amplifier of the frequency equalizer.

It has recently been recognized that frequency equalizers can find effective employment both in professional and non-professional audio fidelity systems. Frequency equalization for the various octave bands in a sound reproduction system has been used for some time in professional audio fidelity equipment, as for example in recording studios and the like. More recently, there have been some frequency equalizers which have been offered commercially for the non-professional market, that is for the home use market. These frequency equalizers are designed to provide discrete octave equalization control of a plurality of octaves in each sound reproduction channel.

These frequency equalizer systems are designed in order to accommodate for room changes and for equalization of various forms of recording mediums, as for example, various types of records. In addition, compensation for radio stations can be obtained by these equalizing systems where some of the stations are noted for excesses in either high or low frequencies. In addition, these frequency equalizer systems are designed for use in equalizing tapes such that the home user can perfectly equalize tape recordings.

Nevertheless, in order to obtain a reasonable market for these frequency equalizers, the producers thereof have attempted to economize in the design and manufacture of these systems which thereby limits the overall versatility and, more particularly, the effectiveness of these frequency equalizer systems. While the professional market does, nevertheless, create a sufficient demand for a more versatile and high-performance frequency equalizer, the non-professional market is only available to frequency equalizers which are capable of being marketed at a relatively low unit cost. Consequently, the producers of the presently available frequency equalizer systems have compromised by merely utilizing the design of the professional equipment and attempting to reduce the same to a consumer compatible market.

Notwithstanding, the deficiencies in the designs of these equalizer systems have seriously hampered the overall effectiveness of the commerically available frequency equalizers. Each of these frequency equalizers utilize some form of tuning circuit for each of the major octave bands for each of the recording and reproducing channels. Nevertheless, the present attempts to produce a home market frequency equalizer system which relies upon the professional design have compromised the effective versatility and efficiency of these equalizer systems since there has been no attempt to redesign the equalizer system and particularly the resonant circuit therefor.

It is therefore the primary object of the present invention to provide an audio fidelity frequency equalizer system which is capable of efficiently controlling the frequency response of each of the octave bands in each of the channels of a sound reproduction of recording.

It is another object of the present invention to provide an audio fidelity frequency equalizer system of the type stated which is constructed with a high degree of quality and is capable of rendering the desired frequency outputs on a relatively low distortion free level.

It is a further object of the present invention to provide an audio fidelity frequency equalizer system of the type stated which is highly reliable in its construction and which can be constructed at a relatively low unit cost.

It is an additional object of the present invention to provide an audio fidelity frequency equalizer system of the type stated which is capable of recducing the effects of hum and other electrical noise resulting from low level switching in the input circuits to the frequency equalizer system.

It is also an object of the present invention to provide an audio fidelity frequency equalizer system of the type stated which is capable of handling inputs of a wide dynamic range and stabilizing the frequency outputs thereof with a very low distortion factor which are relatively noise-free.

With the above and other objects in view, my invention resides in the novel features of form, construction, arrangement and combination of parts presently described and pointed out in the claims.

GENERAL DESCRIPTION

The audio fidelity frequency equalizer system of the present invention generally includes an input means which has an output to a buffer amplifier and the output of this buffer amplifier is introduced into an operational amplifier. Connected across the operational amplifier is a feedback circuit and connected in common with this feedback circuit are a plurality of potentiometers each of which operate in conjunction with a resonant circuit. A separate potentiometer is provided to control the frequency of each of the major octave bands in a particular sound channel.

The potentiometers which provide for control of each of the major octave bands have a movable element which is connected to the resonant circuit. Each of these resonant circuits are designed to regulate the frequency in response to an impedance. In essence, each of these resonant circuits operate as a filter so that the impedance will achieve essentially a zero point value at a particular frequency established by each of the octave bands.

In one aspect of the present invention, the resonant circuit utilizes a transistor which provides for a gain with respect to a capacitor. In another embodiment of the present invention, the resonant circuit utilizes an operational amplifier in feedback relationship with respect to a capacitor circuit.

In each case, the resonant circuit operates as a tune filter, as for example, a phase-shift filter which utilizes a tuned filter. In this respect, the prior art utilizes resonant circuits which also employ a tune filter as a resonant circuit, although the prior art utilizes the far more expensive phase-shift filters.

The present invention also provides a unique feedback around the operational amplifier which obtains a form of symmetrical operation around the amplifier. In this way, it is possible to obtain symmetrical attenuation and gain with respect to the amplifier.

BRIEF DESCRIPTION OF THE DRAWINGS

Figure 1:
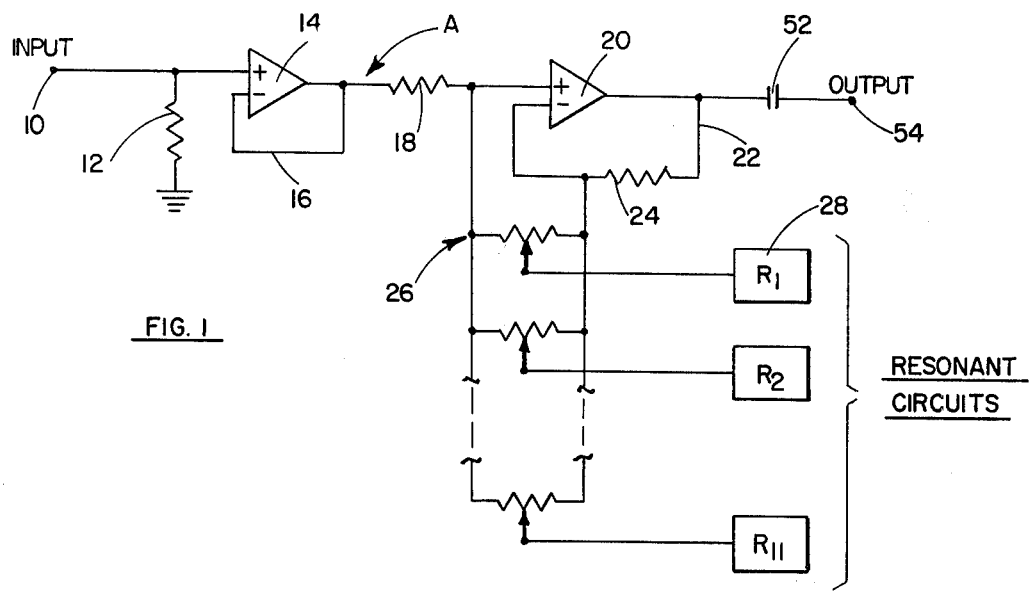
Figure 2:
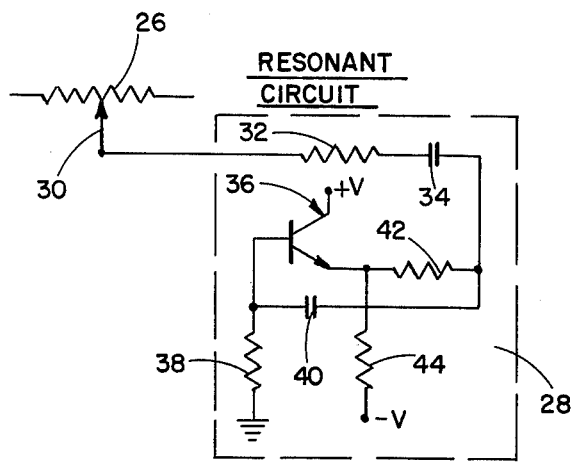
Figure 3:
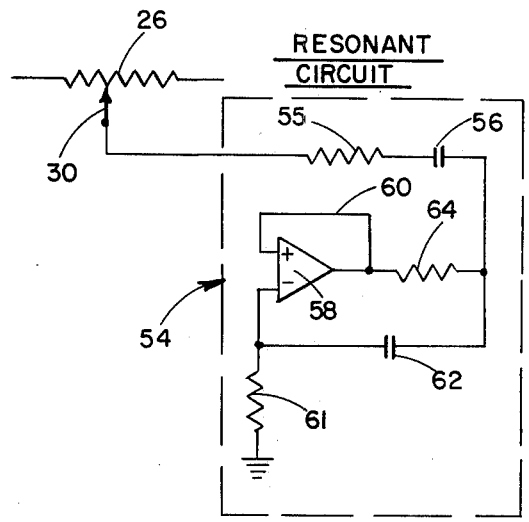
Figure 4:
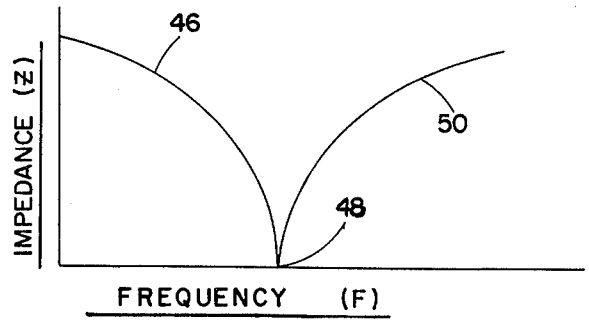

Having thus described the present invention in general terms, reference will not be made to the accompanying drawings in which:

FIG. 1 is a schematic view of the audio fidelity frequency equalizer system of the present invention;

FIG. 2 is a schematic electrical view of one of the resonant circuits forming part of the frequency equalizer of FIG. 1;

FIG. 3 is a schematic electrical view of a modified form of resonant circuit forming part of the frequency equalizer of FIG. 1; and FIG. 4 is a schematic diagram showing a plot of frequency versus impedance as obtained in the frequency equalizer of FIG. 1.

DETAILED DESCRIPTION

Referring now in more detail and by reference character to the drawings which illustrate practical embodiments of the present invention, A designates an audio fidelity frequency equalizer which is capable of being used individually or in conjunction in an integrated form with other audio fidelity equipment. In this case, the frequency equalizer A includes an input terminal designated by reference numeral 10. This input terminal 10 may actually be part of an integrated system, whereas the input is received from a preamplifier, or otherwise the input terminal 10 may form part of a separate and distinct system which is provided in the form of a jack-receiving receptacle to receive the input from the preamplifier or the like.

The input 10 is connected through a limiting resistor 12 connected to ground and to the positive terminal of a buffer amplifier 14. The buffer amplifier 14 has a unity gain feedback path 16 connected across the output and the negative input thereof, in the manner as illustrated in FIG. 1 of the drawings. In this way, the amplifier 14 serves only as a buffer amplifier and does not otherwise affect the input to the circuit of the frequency equalizer A.

The output of the amplifier 14 is connected through a current limiting resistor 18 which is preferably a 39 K ohm resistor to the positive terminal of an operational amplifier 20. Connected across the output of the amplifier 20 and the negative input thereof is a resistive feedback circuit 22 including a 29 K ohm resistor 24.

Connected across the feedback path 22 of the amplifier 20 and the positive input to the amplifier 20 in the manner as illustrated in FIG. 1 of the drawings are a plurality of potentiometer operated octave control circuits 26. Each of these potentiometer circuits 26 include a potentiometer 27 connected in parallel across the feedback circuit 22 and the positive input to the operational amplifier 20, in the manner as illustrated in FIG. 1. Moreover, the movable arm of each of these potentiometers is connected to each, respectively, of eleven individual and discrete resonant circuits 28 and, which in this case, are designated as $R_1, R_2 \ldots R_{11}$.

As indicated, the present invention operates with eleven potentiometer controls for each individual sound channel. While only one of such channels is illustrated in FIG. 1 of the drawings, it should be obvious that for stereophonic sound equalization, two such identical channels would be employed. Nevertheless, in order to maintain simplicity with respect to the present invention, only one of these channels has been illustrated. Moreover, and in this same respect, eleven such frequency equalizer potentiometer controls have been described for each channel in connection with this frequency equalizer; although any number of frequency equalizer controls could be employed. For example, ten frequency equalizer potentiometers 26, or any lesser or greater number thereof, could be utilized. Nevertheless, it has been well established that there are eleven major frequency octave bands which require control for optimum frequency equalization in any input/output relationship. The primary frequencies which are established for equalization in the present invention are 40 Hz, 80 Hz, 150 Hz, 300 Hz, 600 Hz, 1.2 kHz, 2.5 kHz, 5.0 kHz, 10.0 kHz, 15.0 kHz, and 20.0 kHz. Nevertheless, any of the desired octave bands could be established for frequency equalization in accordance with the present invention.

As indicated previously, a number of potentiometers 26 are provided, such that each individual potentiometer 26 is associated with each octave band for frequency equalization. Each of these potentiometers 26 include a movable arm 30 which is connected to the resonant circuit 28. As indicated in FIG. 1, eleven such resonant circuits 28 are employed. Inasmuch as each of these resonant circuits 28 are identical in construction, one of these frequency circuits has been illustrated in FIG. 2 of the drawings and an alternate embodiment has been illustrated in FIG. 3 of the drawings.

Each resonant frequency circuit 28 generally comprises a current limiting resistor 32 which is connected to the movable arm of the potentiometer 30 and is connected through a capacitor 34. In this case, the resistor 32 is preferably a 1 k ohm, whereas each of the potentiometers 26 include a 100 k ohm resistor.

The resonant frequency circuit 28 also includes an NPN transistor 36 where the collector thereof is connected to a positive voltage source such as a 12v voltage source and the base of the transistor 36 is connected through a ground resistor 38 to ground. The base is also connected through a capacitor 40 to the capacitor 34 in the manner as illustrated in FIG. 2. The emitter of the transistor 36 is connected through a resistor 42 also to the capacitor 34, and this emitter is also connected to a negative voltage, such as a −12v voltage, through a resistor 44. In this case, the resistor 42 is preferably a 470 ohm resistor and the resistor 44 is a 47 k ohm resistor.

The transistor 36 effectively operates as an operational amplifier, and is uniquely designed in this construction with relatively low cost to serve as an operational amplifier. Moreover, the transistor 36 in combination with the capacitor 40 serves as an inductance circuit to control the gain of an amplifier circuit which comprises the transistor 36. In this respect, it can be observed that at high frequency inputs, the capacitor 40 has essentially a zero impedance and the transistor would thereby serve as a unity gain follower. Moreover, it can be observed that inasmuch as the transistor 36 operates as an amplifier, it is possible to obtain a symmetrical operation around the amplifier with constant attenuation and gain.

It also can be observed that each of the resonant circuits 28 operate as individual potentiometer circuits such that each individual potentiometer 26 is controlled by the amount of inductance which is regulated by the resonant circuit 28. Thus, if the movable arm of the potentiometer 26 were shifted to one end thereof, the operational amplifier 20 would have a 1-10 gain; whereas, if the movable arm of the potentiometer 26 were shifted to the opposite end thereof, the amplifier 20 would have a 10-1 gain.

It can be recognized that the resonant frequency circuit 28 effectively functions as a capacitive-inductance circuit and in which case the inductance L is connected in series with a capacitor C. Thus, the impedance $Z_L$ of the inductor is represented by the following formula:

$$Z_L = J\omega L$$

where $\omega = 2\pi \times$ frequency. The inductor is essentially constituted by the resistor 33, the capacitor 40 and the resistor 42. The overall impedance $Z_R$ of the resonant circuit is represented by the formula:

$$Z_R = R_{32} + J\omega L - (J/\omega C_{56})$$

As used herein, the decimal digit subscripts represent the components, as for example $R_{32}$ represents the impedance value of the resistor 32. This inductance L is equal to the product of the inductive values of the resistor 38, the resistor 42 and the capacitor 40. Thus, $L = R_{38} R_{42} C_{40}$.

By referring to FIG. 4 of the drawings, it can be observed that the frequency is a function of the impedance and, at a particular inductance level as established by the inductance L as hereinafter described, the circuit will have approximately a zero impedance at a selected octane band frequency. In essence, this resonant circuit initiates from a decreasing curve as established by $Z = -J \; 1\omega C$, designated by reference numeral 46, and reaches an approximte zero point 48, and thereafter increases into a positive impedance curve represented by JL, designated by reference numeral 50. In each of these cases, the letter J represents the real and unreal values of the numbers, such that $-J$ represents the unreal value and $+J$ represents the real value. In essence, and in mathematical terms, J is equal to the square root of $-1$. In any event, it can be noted that the resonant point occurs at a zero impedance level with respect to the frequency.

In essence, and when examining FIG. 4 of the drawings, it can be observed that the ratio of the capacitance to the inductance in each of the resonant circuits 28 determines the sharpness of the resonant circuit which actually serves as a filter and, in this case, the resonant frequency is determined by $L \omega = 1/\omega C$. The use of the electronic simulated inductor in the equalizer circuit provides an unexpected substantial efficiency over the use of a conventional inductor in a resonant circuit. Thus, the equalizer of the present invention is substantially constant and linear with different signal levels. Hence, the output has lower distortion and also provides the advantages of lower cost and smaller physical size.

The output of the operational amplifier 20 is connected through a capacitor 52, which serves as a DC isolation capacitor, and to an output terminal 53. In this case, the output terminal 54 could form part of an integrated system, such as a preamplifier where various inputs are introduced through the input terminal 10 and to the output 53 in order to equalize the various octave bands in a particular channel in a particular system. In addition, the output terminal 53 could serve as the output of the particular frequency equalizer system as an entirely separate unit.

In this respect, it should be observed that the audio fidelity frequency equalizer system A could function as an individual discrete component which may be connected to a preamplifier system or an amplifier system or the like. In like manner, the frequency equalizer system A could function as a separate component which may be connected to auxiliary equipment. In each case, the audio fidelity frequency equalizer A of the present invention would include, in this case, eleven individual potentiometer controls for each of the sound channels. Thus, if a stereophonic equalizer system were required, two such circuits, as illustrated in FIG. 1, would be employed and thereby twentytwo controls would be available. The first eleven of these potentiometer controls would control the octave bands of the first channels, and the second eleven controls would control the octave bands of the second channel. Obviously, the frequency equalizer of the present invention could be used with quadraphonic systems and the like, wherein additional potentiometer controls would be employed. Moreover, and in this same respect, the potentiometers may be operated by slide controls or rotary controls or the like.

FIG. 3 of the drawings illustrates a modified form of resonant frequency circuit which may be utilized in the frequency equalizer circuit of FIG. 1. In this case, the resonant frequency circuit 54 includes a resistor 55, similar to the resistor 32, and a capacitor 56, similar to the capacitor 34, which is connected to the movable arm 30 of a particular potentiometer 26. The resonant frequency circuit 54 includes an operational amplifier 58 in place of the transistor 36 and which is provided with a unity gain feedback 60 connected across the output of the amplifier 58 and the positive input thereof. The negative input to the amplifier 58 is connected to found and through resistor 61. Connected to the resistor 61 as shown is a capacitor 62, equivalent to the capacitor 40. Moreover, the output is connected through a current limiting resistor 62, equivalent to the resistor 42. Thus, in this case, it can be observed that the amplifier 58, in combination with the capacitor 62, also functions to provide an inductive circuit. In this case, it can be observed that the resonant frequency circuit 54, as illustrated in FIG. 3 of the drawings, operates in a manner similar to the resonant frequency circuit 28 of FIG. 2 of the drawings. Nevertheless, the resonant frequency circuit 28 is far less costly and equally as efficient as the circuit of FIG. 3 inasmuch as the circuit 28 only utilizes a single transistor 36.

In accordance with the above description, it can be observed that audio fidelity frequency equalizer systems of the present invention provide discrete octave equalization control of eleven major octaves on each channel. Moreover, the equalization control is designed so that it can provide less than 12 db equalization for each octave. In this same respect, a full spectrum level control can be provided for each channel. If desired, automatic continuous monitoring by use of light emitting diodes or other signal sources could be provided for visual warning of overload in each of the output circuits. Moreover, the frequency equalization circuit of the present invention provides for tape dubbing between two or more tape transports with optimal, simultaneous equalization and monitoring, or otherwise double-dubbing into two tape transports simultaneously or with separate system selection to enable full use of all other functions during the tape dubbing operations.

Thus, there has been illustrated and described a unique and novel audio fidelity frequency equalizer system which may operate as an individual unit, or otherwise integrated into a preamplifier or preamplifier-amplifier combination, and which serves to control each of the major octave bands of any particular channel, and which therefore fulfills all of the objects and advantages sought therefor. It should be understood that many changes, modifications, variations and other uses and applications will become apparent to those skilled in the art after considering this specification and the accompanying drawings. Therefore, any and all such changes, modifications, variations and other uses and applications which do not depart from the spirit and scope of the invention are deemed to be covered by the invention which is limited only by the following claims.

Having thus described the invention, what I desire to claim and secure by letters patent is:

1. An audio fidelity frequency equalizer system comprising input means, an operational amplifier operatively connected to said input means, a resistive feedback path connected across an output of and an input to said operational amplifier, a plurality of discrete octave band potentiometer elements connected between said feedback circuit and said first named input to said operational amplifier and where said frequency controlling potentiometer elements are connected in parallel ralationship with respect to each other and with respect to the output of and the first named input to said operational amplifier, an individual resonant octave band control circuit connected with respect to each said octave band control potentiometer element, and each said resonant control circuit including an inductive-capacitive circuit therein comprised of an electronically active simulated inductor and a capacitor connected thereto, each said octave band control circuit operating in conjunction with the associated potentiometer element to adjust the frequency of a particular octave band as a function of the inductance generated by the electronically active simulated inductor.

2. The audio fidelity frequency equalizer system of claim 1 further characterized in that said inductive-capacitive circuit includes a second operational amplifier and a capacitor connected in feedback relationship thereacross.

3. The audio fidelity frequency equalizer system of claim 1 further characterized in that the inductive-capacitive circuit includes an NPN transistor with a capacitor connected in feedback relationship thereacross.

4. The audio fidelity frequency equalizer system of claim 1 further characterized in that an impedance amplifier is connected between the input means and the operational amplifier thereof and which includes a unity gain feedback path thereacross.

5. The audio fidelity frequency equalizer system of claim 1 further characterized in that a capacitive circuit isolation element is connected to the output of the operational amplifier.

6. The audio fidelity frequency equalizer system of claim 1 further characterized in that each octave band of each frequency channel has a resonant frequency approaching approximately zero frequency at a selected input impedance with respect to the octave band value setting.

7. A method of controlling the frequency outputs of the various major octave bands in a frequency channel of an audio fidelity sound reproducing system, said method comprising buffering the input to an equalization system to reduce transients therefrom, introducing the buffered input into an operational amplifier, creating a resistive feedback path around said operational amplifier from the input to an output of said amplifier, dividing each of the major octave bands in a channel such that a resonant frequency circuit is capable of controlling each of the major octave bands, electronically generating a simulated inductance through an amplifier type element and a capacitor connected thereto in said resonant frequency circuit and introducing the simulated inductance as an input to said operational amplifier through said resistive feedback path, establishing a zero impedance for each selected octave band frequency in a channel and adjusting the frequency of a selected octave band as a function of the generated inductance and thereby achieving a resonant point for each frequency during the generation of the simulated inductance, and generating an output from said amplifier for each selected octave band.

8. The method of claim 7 further characterized in that said method comprises determining the resonant frequency by means of a capacitive-inductive circuit comprised of said amplifier type element and capacitor and thereby controlling the gain of the operational amplifier.

9. The method of claim 7 further characterized in that DC isolation is connected across the output of the equalizer system in order to eliminate any DC output transients.

10. An audio fidelity frequency equalizer system comprising input means, an operational amplifier operatively connected to said input means, a resistive feedback path connected across an output of and an input to said operational amplifier, a plurality of discrete octave band potentiometer elements connected between said feedback circuit and said first named input to said operational amplifier and where said frequency controlling potentiometer elements are connected in parallel relationship with respect to each other and with respect to the output of and the first named input to said operational amplifier, an individual resonant octave band control circuit connected with respect to each said octave band control potentiometer element, each said resonant control circuit comprising an electronically active amplifier type element operating as an electronically active simulated inductor, capacitive means connected in series relationship to said amplifier type element, each said octave band control circuit operating in conjunction with the associated potentiometer element to adjust the frequency of a particular octave band as a function of the inductance generated by the electronically active amplifier type element, and establishing a zero impedance for each selected octave band frequency in a channel thereby achieving a resonant point for such frequency.

11. The audio fidelity frequency equalizer system of claim 10 further characterized in that the capacitive means is a capacitor connected across said amplifier type element.

12. The audio fidelity frequency equalizer system of claim 11 further characterized in that a resistor is connected to the output of said amplifier type element, said capacitor is connected to said resistor and a terminal of the amplifier type element.

13. The audio fidelity frequency equalizer system of claim 10 further characterized in the said electronically active inductor comprises a second operational amplifier and a capacitor connected in feedback relationship thereacross.

14. The audio fidelity frequency equalizer system of claim 10 further characterized in that the electronically active inducter comprises an NPN transistor with a capacitor connected in feedback relationship thereacross.

15. An audio fidelity frequency equalizer system comprising input means, an operational amplifier terminal having a pair of inputs and an output terminal, one of said input terminals being operatively connected to said input means, a resistive feedback path connected across an output terminal of and the other of said input terminals to said operational amplifier, a plurality of discrete octave band potentiometer elements connected between said feedback circuit and said first named input to said operational amplifier and where said frequency controlling potentiometer elements are connected in parallel relationship with respect to each other and with respect to the output of and the first named input to said operational amplifier, an individual resonant octave band control circuit connected with respect to each said octave band control potentiometer element, and each said resonant control circuit including an inductive-capacitive circuit therein comprised of a series connected electronically simulated inductor and capacitor.

16. The audio fidelity frequency equalizer system of claim 15 further characterized in that said inductive-capacitive circuit includes a second operational amplifier and a capacitor connected in feedback relationship thereacross.

17. The audio fidelity frequency equalizer system of claim 15 further characterized in that the inductive-capacitive circuit includes an NPN transistor with a capacitor connected in feedback relationship thereacross.

* * * * *